United States Patent
Namba

(10) Patent No.: US 9,332,667 B2
(45) Date of Patent: May 3, 2016

(54) ELECTRONIC APPARATUS

(71) Applicant: BROTHER KOGYO KABUSHIKI KAISHA, Nagoya-shi, Aichi-ken (JP)

(72) Inventor: Mamoru Namba, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 295 days.

(21) Appl. No.: 14/040,559

(22) Filed: Sep. 27, 2013

(65) Prior Publication Data

US 2014/0092538 A1   Apr. 3, 2014

(30) Foreign Application Priority Data

Sep. 28, 2012 (JP) ................................. 2012-218712

(51) Int. Cl.
*G03G 15/00* (2006.01)
*H05K 7/14* (2006.01)

(52) U.S. Cl.
CPC .............. *H05K 7/14* (2013.01); *G03G 15/5016* (2013.01)

(58) Field of Classification Search
CPC .................................................. G03G 15/5016
USPC ........................................................... 399/81
See application file for complete search history.

(56) References Cited

U.S. PATENT DOCUMENTS

| | | | | |
|---|---|---|---|---|
| 5,924,782 A * | 7/1999 | Park | ......................... | G06F 1/181 16/342 |
| 7,231,159 B2 * | 6/2007 | Combs | ............... | G03G 15/5016 399/107 |
| 8,909,085 B2 * | 12/2014 | Short | ................. | G03G 15/5016 399/81 |
| 9,079,540 B2 * | 7/2015 | Harding | .................. | B60R 11/02 |
| 2003/0174834 A1 * | 9/2003 | Kida | ....................... | H04M 1/02 379/428.01 |
| 2006/0198094 A1 * | 9/2006 | Kano | ......................... | G06F 1/16 361/679.09 |
| 2008/0068787 A1 * | 3/2008 | Okada | ................ | G03G 15/5016 361/679.43 |
| 2008/0232050 A1 * | 9/2008 | Muraki | .............. | G03G 15/5016 361/679.06 |
| 2010/0322410 A1 * | 12/2010 | Lin | ...................... | H04M 1/0295 379/428.03 |
| 2012/0155909 A1 * | 6/2012 | Hashimoto | ............ | G03G 15/60 399/81 |
| 2012/0305726 A1 * | 12/2012 | Hashimoto | ............ | F16M 11/10 248/292.12 |

FOREIGN PATENT DOCUMENTS

JP       2004-133243 A    4/2004

* cited by examiner

*Primary Examiner* — Anthony Q Edwards
(74) *Attorney, Agent, or Firm* — Merchant & Gould P.C.

(57) ABSTRACT

An electronic apparatus includes: a panel having at least one of an input section and a display section; a main body configured to retain the panel rotatably; and a retention mechanism configured to retain the panel at a predetermined rotation angle. The retention mechanism includes: a retaining member provided in the main body; a retained member provided on the panel and configured to be retained by the retaining member; an elastic deformation member configured to be connected to the retained member and changeable between a first state in which the elastic deformation member is not elastically deformed and a second state in which the elastic deformation member is elastically deformed; a contact member configured to contact with the elastic deformation member and change the state of the elastic deformation member; and an operating member configured to receive an operation for making the elastic deformation member contact with the contact member.

18 Claims, 11 Drawing Sheets

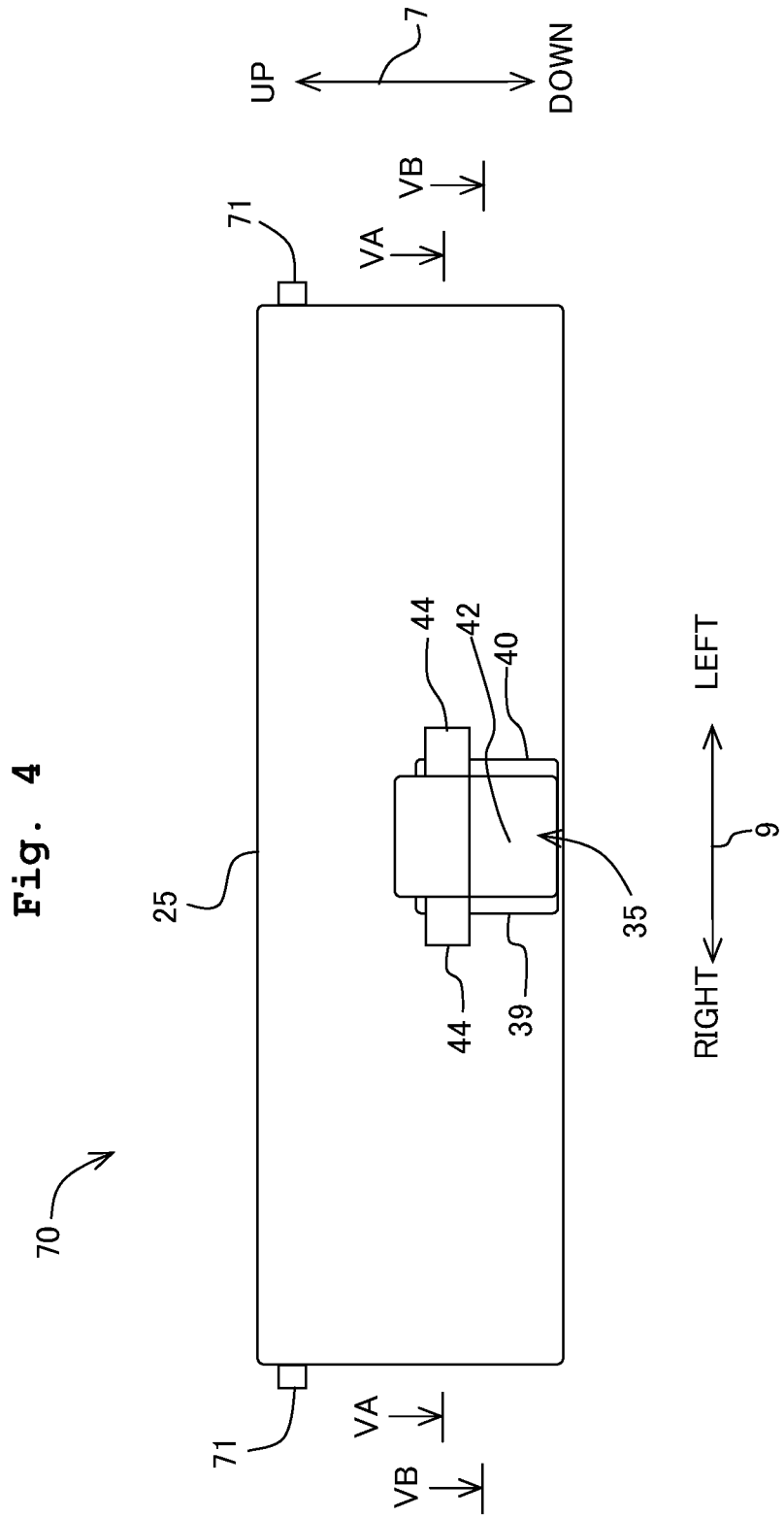

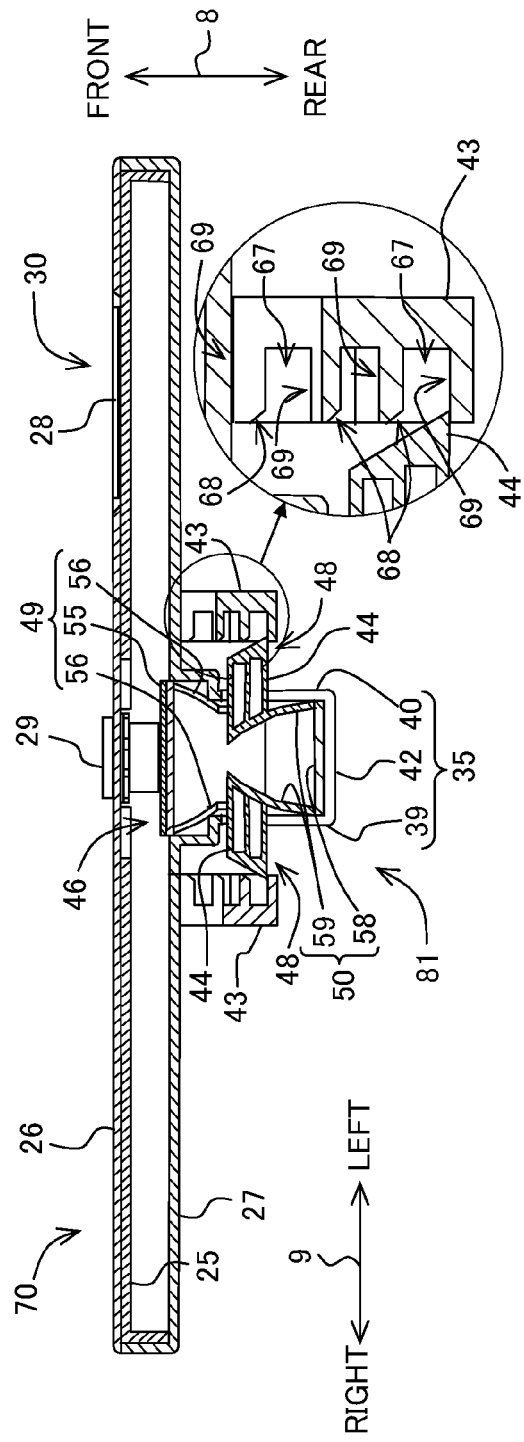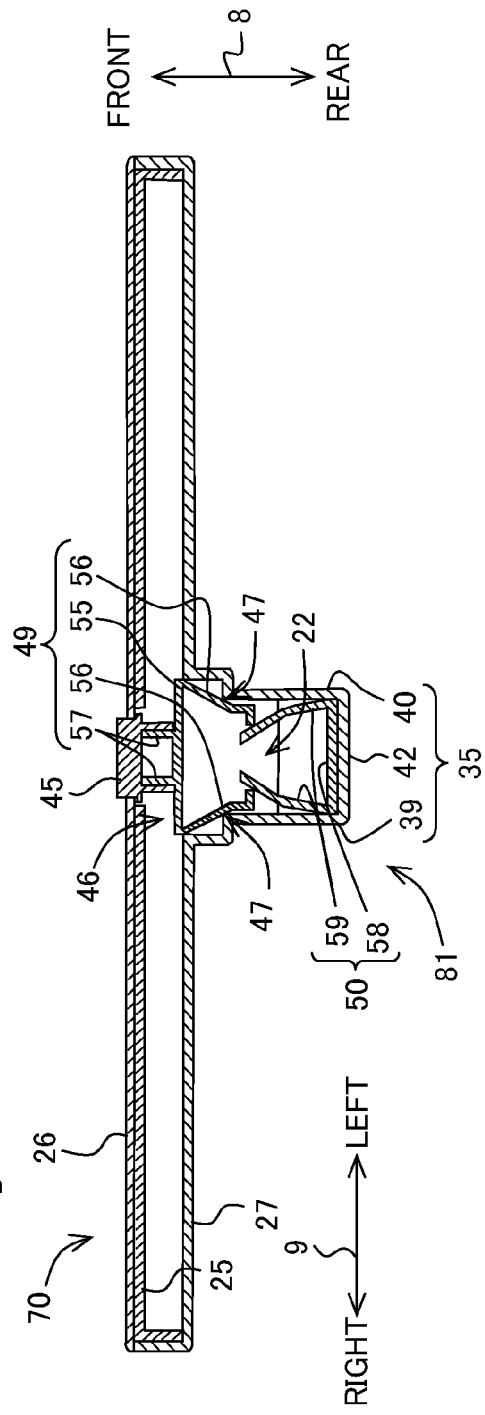

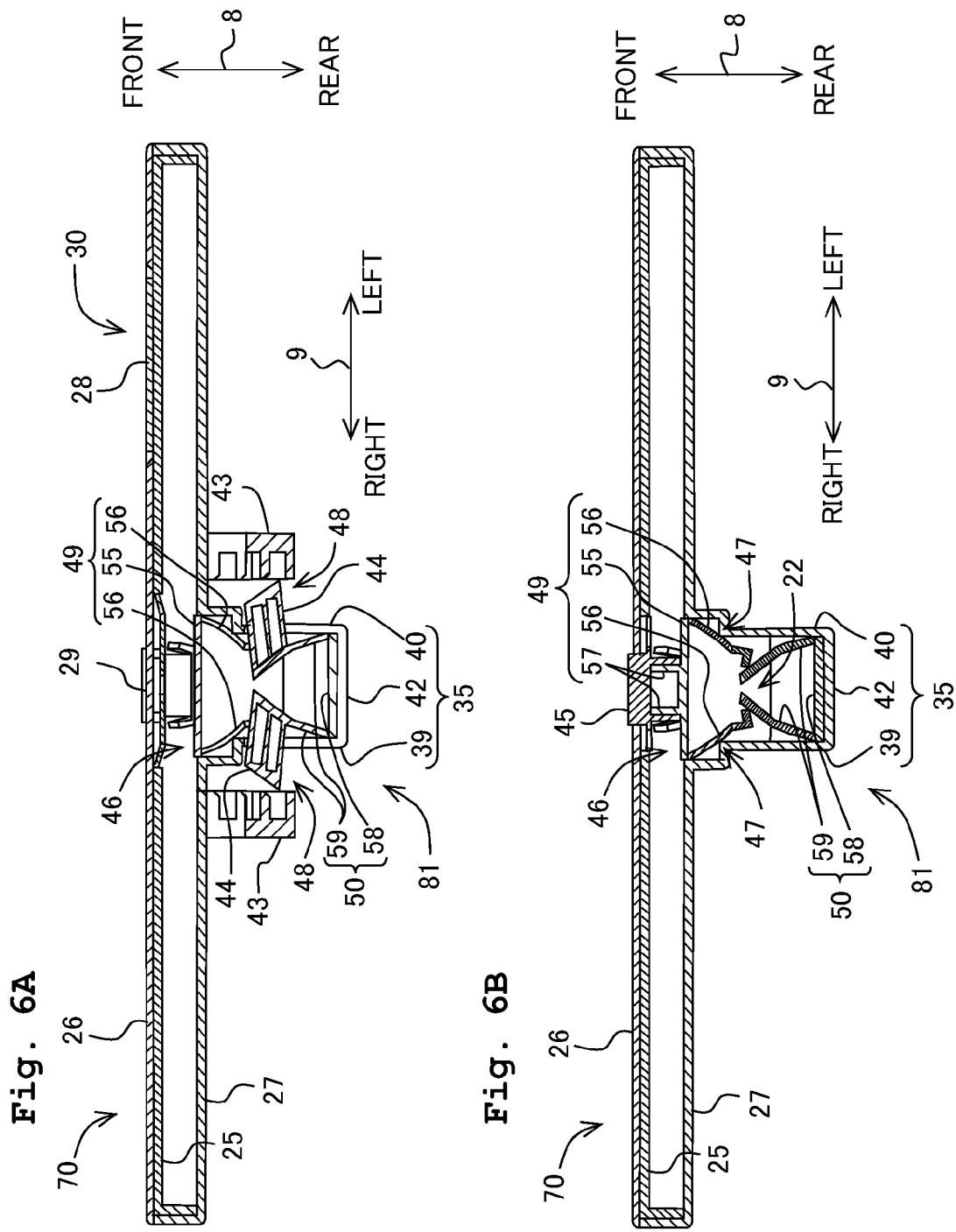

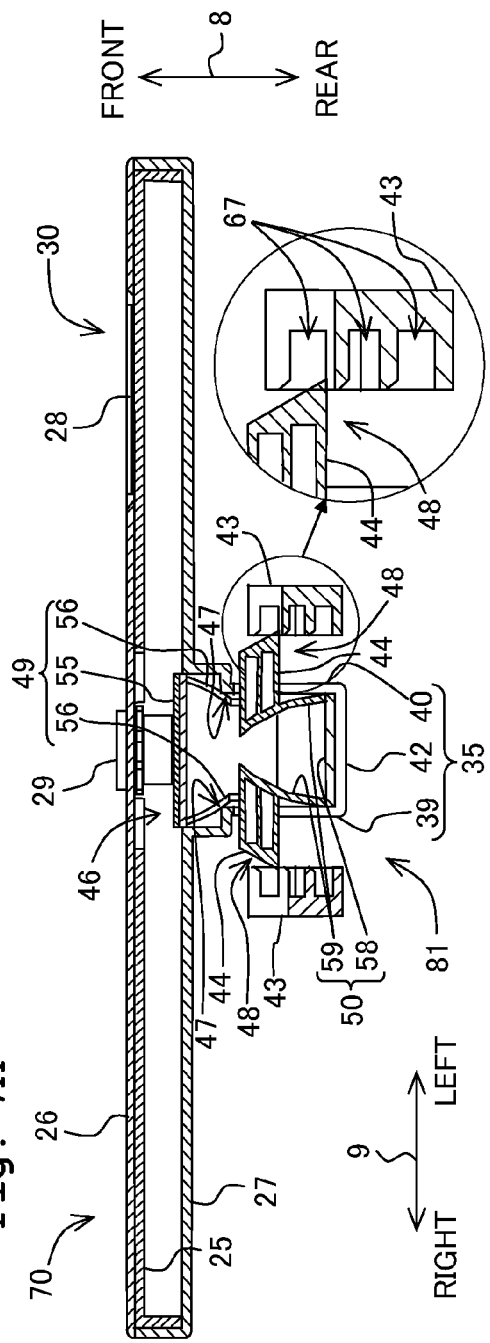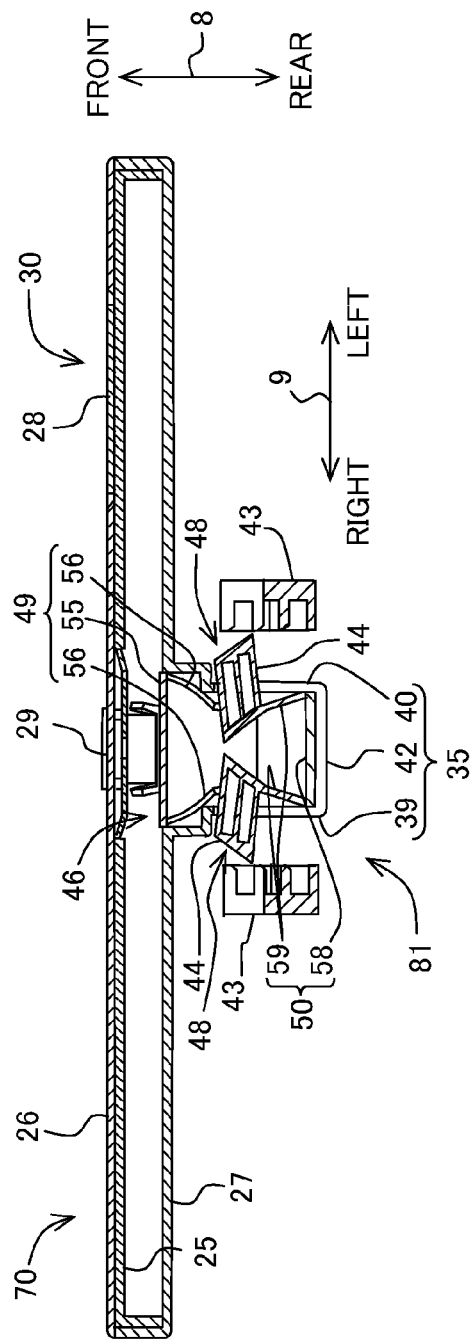

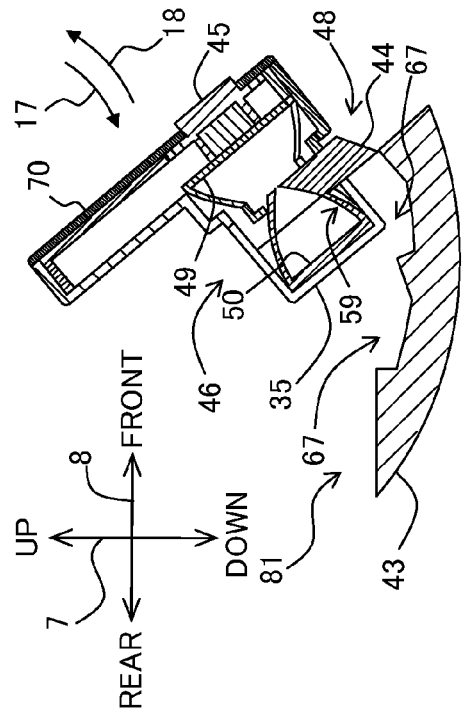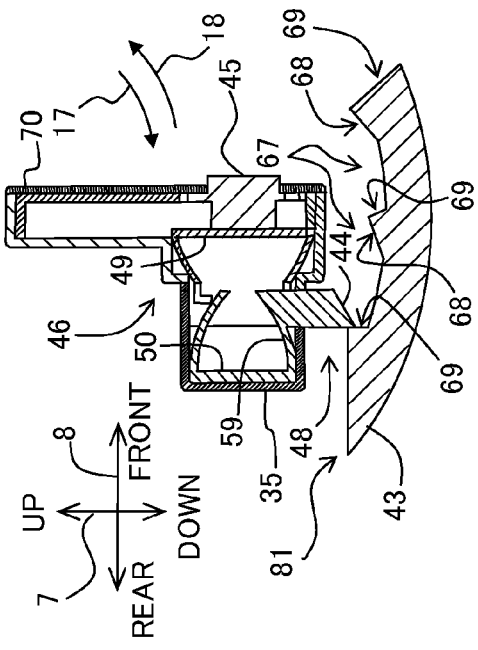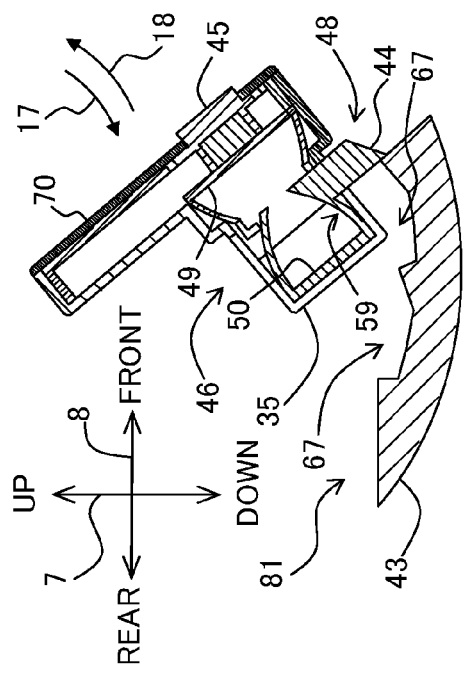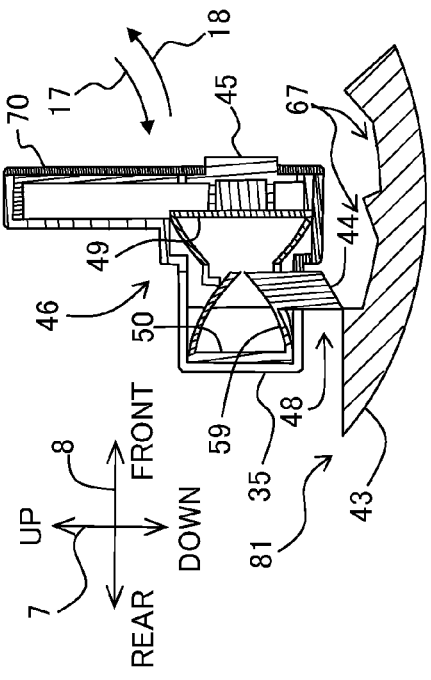
Fig. 9A
Fig. 9B
Fig. 9C
Fig. 9D

ELECTRONIC APPARATUS

CROSS REFERENCE TO RELATED APPLICATION

The present application claims priority from Japanese Patent Application No. 2012-218712, filed on Sep. 28, 2012, the disclosure of which is incorporated herein by reference in its entirety.

BACKGROUND OF THE INVENTION

1. Field of the Invention

The present invention relates to an electronic apparatus including a panel which is rotatably provided in its main body, and a retention mechanism which retains the panel at a predetermined rotation angle.

2. Description of the Related Art

Conventionally, as electronic apparatuses having a panel, there have been printers, scanners, copy machines, facsimile machines, and the like.

It is assumable that the panel is operated either from the upper side of the apparatus or from the front side of the apparatus. Therefore, if the panel is directed to the apparatus upper side, the operability from the front side becomes bad. On the other hand, if the panel is directed to the apparatus front side, the operability from the upper side becomes bad. In order to solve this problem, such a panel is proposed as is rotatably provided in the apparatus main body, and is capable of posture change to face to an arbitrary direction between the apparatus upper side and the apparatus front side. In electronic apparatuses provided with such panel, there is provided a so-called tilt mechanism, i.e., a mechanism capable of retaining the panel in a predetermined posture.

Many tilt mechanisms are provided with a lock mechanism for retaining the panel in a predetermined posture. For example, Japanese Patent Application Laid-Open No. 2004-133243 discloses an apparatus provided with a mechanism which locks the panel in a predetermined posture by causing a claw member provided on the panel to engage with a recess provided in the main body.

The apparatus disclosed in Japanese Patent Application Laid-Open No. 2004-133243 is provided with a biasing means such as a coil spring or the like to bias the claw member toward a direction in which the claw member engages with the recess. By virtue of this, the panel is maintained in a predetermined posture. Further, the apparatus disclosed in Japanese Patent Application Laid-Open No. 2004-133243 disengages the claw member from the recess against the biasing force of the biasing means by pressing a pressure member provided on the panel.

SUMMARY OF THE INVENTION

However, in the apparatus disclosed in Japanese Patent Application Laid-Open No. 2004-133243, in a state that the panel is maintained in a predetermined posture, the biasing means constantly biases the claw member in the direction in which the claw member engages with the recess. Hence, the following problem occurs. That is, because the biasing means constantly biases the claw member, age-related deterioration is liable to occur in the biasing means. As a result, the biasing means becomes incapable of applying a stable biasing force to the claw member to engage with the recess.

The present invention is made in view of the above problem, and an object thereof is to provide an electronic apparatus capable of retaining a rotatable panel in a predetermined posture stably.

According to an aspect of the present invention, there is provided an electronic apparatus including: a panel having at least one of an input section to which operation instructions for the electronic apparatus are inputted and a display section; a main body configured to retain the panel rotatably; a retention mechanism configured to retain the panel at a predetermined rotation angle and including: a retaining member provided in the main body; a retained member provided on the panel and configured to be retained by the retaining member; an elastic deformation member configured to be connected to the retained member and to be changeable between a first state in which the elastic deformation member is not elastically deformed and a second state in which the elastic deformation member is elastically deformed; a contact member configured to contact with the elastic deformation member and change the state of the elastic deformation member; and an operating member configured to receive an operation for making the elastic deformation member contact with the contact member, wherein in a state that the elastic deformation member is in the first state, the retained member is retained by the retaining member, and in a state that the elastic deformation member is in the second state, the retained member is separated from the retaining member.

According to this configuration, the elastic deformation member elastically deforms only when the panel is rotated by the retained member being separated from the retaining member, but does not elastically deform when the panel is retained at the predetermined rotation angle by the retained member being retained by the retaining member. The time of retaining the panel at the predetermined rotation angle is overwhelmingly longer than the time of rotating the panel. Hence, according to this configuration, it is possible to reduce age-related deterioration of the elastic deformation member due to longtime elastic deformation. As a result, it is possible to stably retain the panel in a predetermined posture.

BRIEF DESCRIPTION OF THE DRAWINGS

FIGS. 1A and 1B are external perspective views of a multifunction printer, wherein FIG. 1A shows a state of a panel at a first position, and FIG. 1B shows a state of the panel at a second position.

FIG. 4 is a rear view of the panel and the retention mechanism.

FIG. 5A schematically shows a VA-VA section of FIG. 4 when the panel is at the first position and an elastic deformation member is in a first state, and FIG. 5B schematically shows a VB-VB section of FIG. 4 when the panel is at the first position and the elastic deformation member is in the first state.

FIG. 6A is a VA-VA sectional view of FIG. 4 when the panel is at the first position and the elastic deformation member is in a second state, and FIG. 6B is a VB-VB sectional view of FIG. 4 when the panel is at the first position and the elastic deformation member is in the second state.

FIG. 7A schematically shows a VA-VA section of FIG. 4 when the panel is at a second position and the elastic deformation member is in the first state, and FIG. 7B schematically shows a VB-VB section of FIG. 4 when the panel is at the second position and the elastic deformation member is in the second state.

FIGS. 9A to 9D are longitudinal sectional views of the panel and retention mechanism in accordance with the first modification, wherein FIG. 9A is the longitudinal sectional view when the panel is at the second position and the elastic deformation member is in the first state, FIG. 9B is the longitudinal sectional view when the panel is at the second position and the elastic deformation member is in the second state, FIG. 9C is the longitudinal sectional view when the panel is at the first position and the elastic deformation member is in the second state, and FIG. 9D is the longitudinal sectional view when the panel is at the first position and the elastic deformation member is in the first state.

DESCRIPTION OF THE PREFERRED EMBODIMENT

Figure 1A:
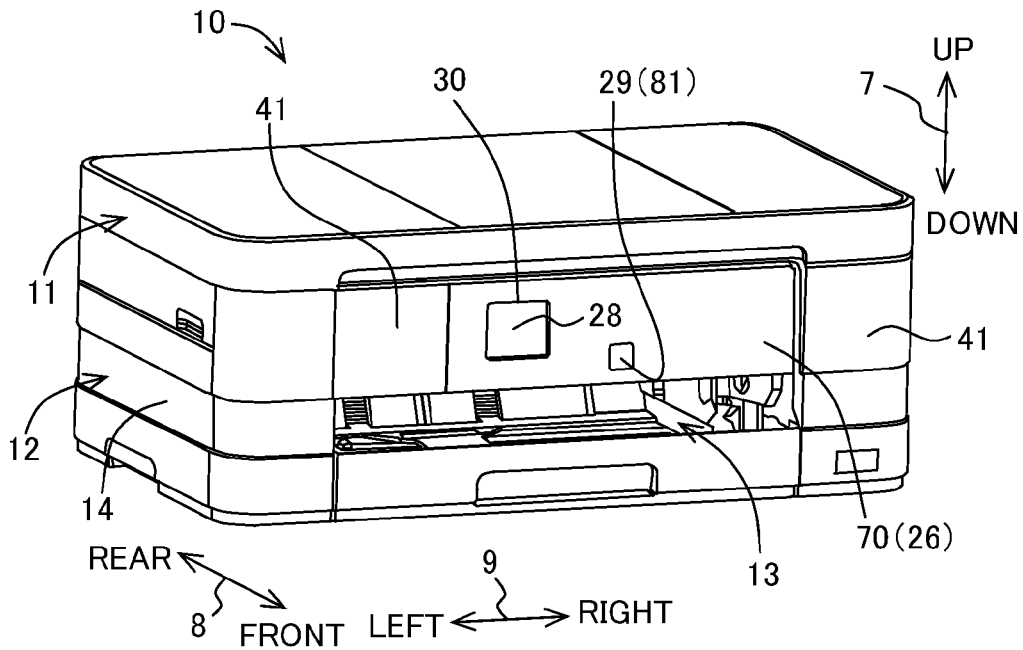

Hereinbelow, an embodiment of the present invention will be explained. Further, it is needless to say that the embodiment explained below is merely an example of the present invention, and thus it is possible to appropriately change the embodiment of the present invention without departing from the true spirit and scope of the present invention. Further, in the following explanations, an up-down direction 7 is defined with reference to such a state (the state of FIG. 1A) that a multifunction printer 10 (an example of the electronic apparatus of the present invention) is placed to be operable; a front-rear direction 8 is defined to let the front side (front face) be the side in which an opening 13 is provided; and a left-right direction 9 is defined as the multifunction printer 10 is viewed from the front side (front face). Further, in the following explanation of each member, the up-down direction 7, front-rear direction 8 and left-right direction 9 are defined with the each member being fitted in the multifunction printer 10.

<An Overall Configuration of the Multifunction Printer 10>

Figure 1B:
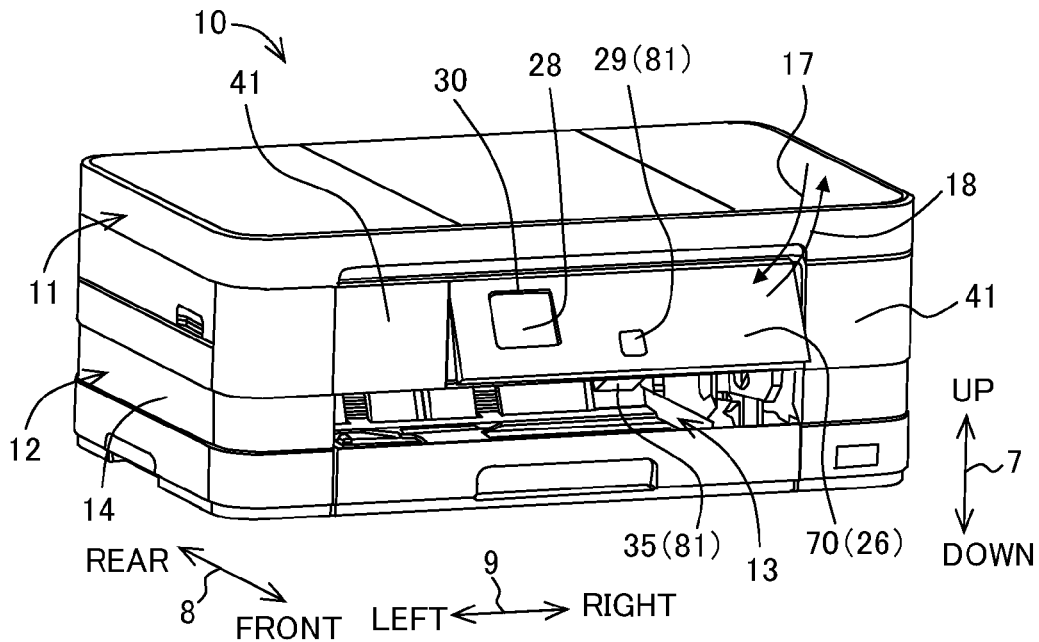

As shown in FIGS. 1A and 1B, the multifunction printer 10 is formed into an approximately cuboid body. The multifunction printer 10 includes a scanner portion 11 in its upper portion to acquire image data by letting an image sensor read or scan images recorded on a manuscript such as recording paper or the like. Further, the multifunction printer 10 includes a printer section 12 in its lower portion to record images on a sheet of recording paper 15 based on the above image data or the like.

While the scanner portion 11 is configured as a so-called flat head scanner, hereinbelow, however, any detailed explanation of the internal configuration of the scanner portion 11 will be omitted. The printer section 12 is also formed into an approximately cuboid body, and has a printer case 14 (an example of the main body of the present invention) with the opening 13 formed in the front side.

Figure 10:
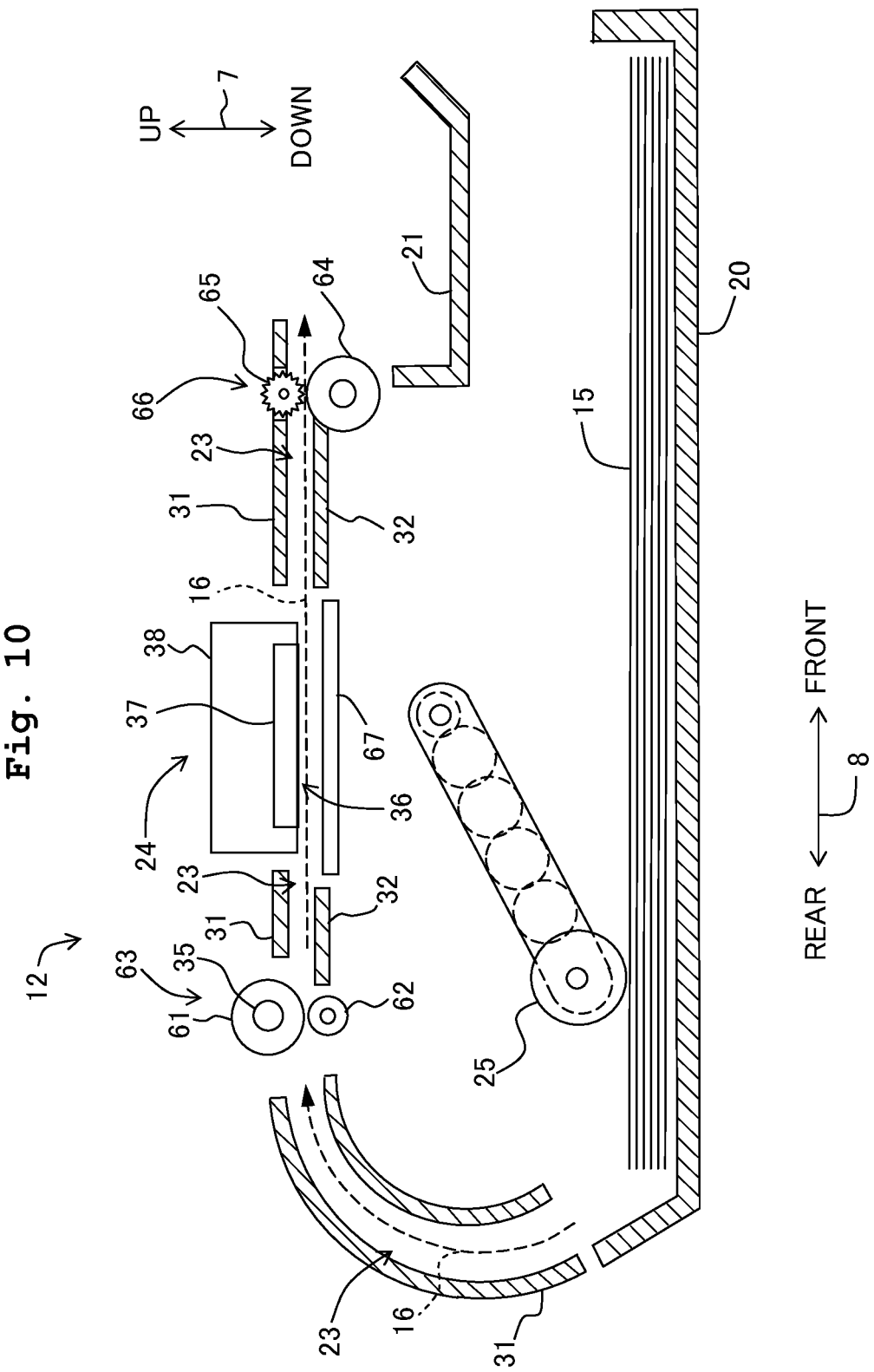
FIG. 10 is a longitudinal sectional view schematically showing an internal structure of a printer section.

As shown in FIG. 10, inside the printer case 14 of the printer section 12, there are arranged a paper feed tray 20 which is insertable to and removable from the opening 13 in the front-rear direction 8 and in which the recording paper 15 is contained, a transport roller pair 63 and a discharge roller pair 66 which transport the recording paper 15 contained in the paper feed tray 20 along a transport path 23, a recording section 24 which records images on the recording paper 15 transported through the transport path 23 based on the image data or the like read by the scanner portion 11 from the manuscript, etc.

The recording paper 15, on which images have been recorded, is discharged to a paper discharge tray 21 provided above the paper feed tray 20 to be loaded in the paper discharge tray 21. Here, the paper discharge tray 21 is provided above the paper feed tray 20 to superimpose the paper feed tray 20, and is insertable to and removable from the opening 13 as one body with the paper feed tray 20.

<The Transport Path 23>

As shown in FIG. 10, the transport path 23 is a pathway which, with a rear end portion of the paper feed tray 20 as the starting point, extends upward from below, and then extends frontward to the paper discharge tray 21 after a U-turn. The transport path 23 is a space configured by a first guide member 31 and a second guide member 32 facing each other at a predetermined interval. The recording paper 15 is transported through the transport path 23 in a transport orientation 16 shown by the dashed arrow in FIG. 10.

<The Transport Roller Pair 63 and the Discharge Roller Pair 66>

As shown in FIG. 10, the transport roller pair 63 constituted by a transport roller 61 and a pinch roller 62 is provided on the upstream side to the recording section 24 in the transport orientation 16 on the transport path 23. The pinch roller 62 is pressed against the roller surface of the transport roller 61 by an elastic member (not shown) such as a spring or the like. The discharge roller pair 66 constituted by a discharge roller 64 and a spur 65 is provided on the downstream side from the recording section 24 in the transport orientation 16 on the transport path 23. The spur 65 is pressed against the roller surface of the discharge roller 64 by another elastic member (not shown) such as a spring or the like.

The transport roller 61 and the discharge roller 64 are rotated by a driving force transmitted from a motor for the transport (not shown). The transport roller 61 and the discharge roller 64, to which the driving force is transmitted, sandwich the recording paper 15 respectively with the pinch roller 62 and the spur 65 while transporting the same in the transport orientation 16.

<The Recording Section 24>

As shown in FIG. 10, the recording section 24 is arranged above the transport path 23. The recording section 24 includes a recording head 37 provided to be able to face the transport path 23, and a carriage 38 on which the recording head 37 is mounted. In the recording head 37, a plurality of nozzles 36 are formed for jetting the ink supplied from an ink cartridge (not shown) toward the transport path 23. The carriage 38 is configured to be reciprocatingly movable in the left-right direction 9. While the recording head 37 is moving reciprocatingly along with the carriage 38 in the left-right direction 9, ink drops are jetted from the nozzles 36 toward the recording paper 15 transported along the transport path 23. By virtue of this, images are recorded on the recording paper 15.

Further, in this embodiment, the method for the recording section 24 to record images on the recording paper 15 is an ink-jet recording method. However, the recording method of the recording section 24 is not limited to the ink-jet recording method, but may also be, for example, an electrophotographic method or the like.

<An Overall Configuration of an Electronic Apparatus>

An electronic apparatus is mounted on the multifunction printer 10. As shown in FIGS. 1A through 2B, the electronic apparatus includes the aforementioned printer case 14, a panel 70 rotatably supported by the printer case 14, and a retention mechanism 81 retaining the panel 70 at a predetermined rotation angle.

<The Panel 70>

As shown in FIGS. 1A and 1B, the upper-end vicinity of the panel 70 is axially supported to be rotatable by a member constituting a front surface 41 of the printer case 14. As shown in FIGS. 2A through 4, at both ends of the upper-end vicinity of the panel 70 in the left-right direction 9, a rotation shaft 71 is formed as protrusions to extend outward. That is, the rotation shaft 71 extends in the left-right direction 9. In the member constituting the front surface 41 of the printer case 14, a hole (not shown) is formed at the position facing the rotation shaft 71 extending from the right end of the panel 70. By inserting the rotation shaft 71 into this hole, the panel 70 becomes rotatable with the upper-end vicinity as the axis.

The panel 70 is rotatable about the rotation shaft 71 between a first position shown in FIG. 1A and a second position shown in FIG. 1B. In detail, the panel 70 rotates in a direction shown by an arrow 18 rotating from the first position to the second position (an example of one direction of the present invention), and in a direction shown by an arrow 17 rotating from the second position to the first position (an example of the other direction of the present invention).

As shown in FIG. 1A, in this embodiment, with the panel 70 at the first position, the front surface 41 of its anterior surface stands up along the printer case 14. With the panel 70 at the second position, the front surface 41 of its anterior surface inclines frontward, that is, outward from the multifunction printer 10 with respect to the printer case 14. In this embodiment, with the panel 70 at the second position, its lower-end portion is positioned more frontward than with the panel 70 at the first position. That is, with the panel 70 at the second position, its rotation fore-end is more separate from the printer case 14 than with the panel 70 at the first position. Further, if the front surface 41 of the panel 70 at the second position inclines more frontward than the front surface 41 of the panel 70 at the first position, then the front surface 41 of the panel 70 at the first position may also not stand up along the printer case 14.

Further, the rotation shaft 71 of the panel 70 may also be provided somewhere else other than in the upper-end vicinity of the panel 70. For example, the rotation shaft 71 may be provided in either the lower-end vicinity or the central-part vicinity of the panel 70 in the up-down direction 7. Further, the rotation shaft 71 of the panel 70 may also extend in another direction than the left-right direction 9. For example, the rotation shaft 71 may extend in the up-down direction 7.

Figure 3:
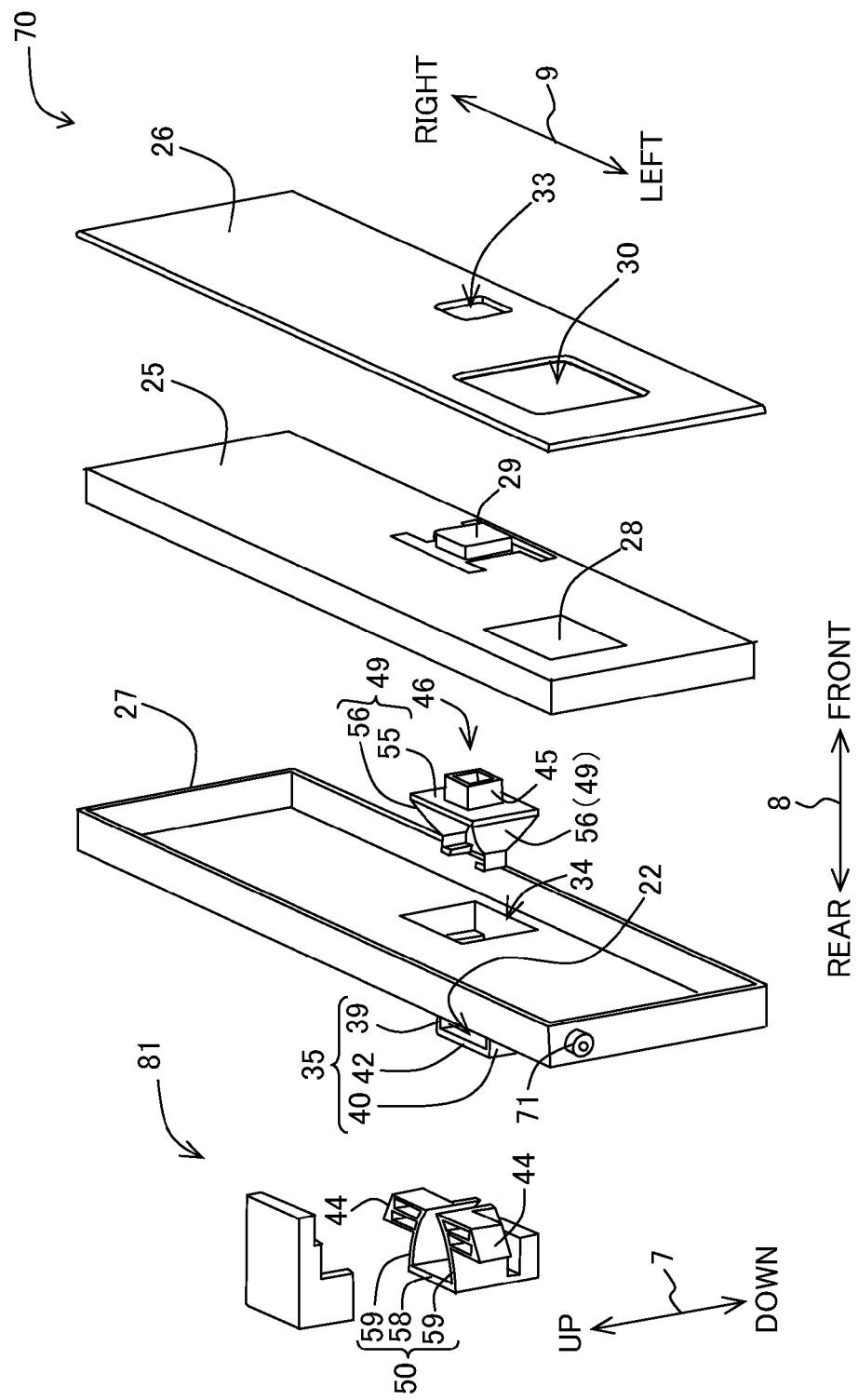
FIG. 3 is an exploded perspective view of the panel and a retention mechanism.

As shown in FIGS. 3, 5A and 5B, the panel 70 includes a panel body 25, a front cover 26, and a rear cover 27.

The panel body 25 has an approximately cuboid shape. A liquid crystal panel 28 of a touch panel, an operation key 51, and the like are arranged on the front surface of the panel body 25. A control circuit substrate (not shown) and the like are fitted inside the panel body 25 for the touch panel, operation key 51 and the like. The touch panel displays predetermined information on the liquid crystal panel 28, and lets instructions be inputted for operations of the multifunction printer 10 by pressing keys displayed on the liquid crystal panel 28. That is, the touch panel is an example of the display section and input section of the present invention. Further, pressing the operation key 51 lets an instruction be inputted for another operation of the multifunction printer 10. That is, the operation key 51 is an example of the input section of the present invention. Further, the operation key 51 is shown only in FIG. 2A, but omitted in the other figures.

A rubber key 29 is provided in the panel body 25. The rubber key 29 is a thin-film-like member formed from such a material as silicon rubber, natural rubber, urethane rubber, or the like. The rear side of the rubber key 29 is opened to form a recess. An aftermentioned operating member 45 is inserted into this recess. By virtue of this, if the rubber key 29 is pressed from the front side, then because the rubber key 29 bends rearward, the operating member 45 is pressed rearward. The rubber key 29 is formed in the lower-end vicinity of the panel 70. That is, the rubber key 29 is formed on the rotation fore-end side downward from the rotation shaft 71 of the panel 70.

The front cover 26 is a plate-like member, and is fitted to cover the front surface of the panel body 25 for protecting the panel body 25. An opening 30 is formed in the front cover 26 for exposing the liquid crystal panel 28 to the outside of the multifunction printer 10. The opening 30 is formed at a position facing the liquid crystal panel 28 when the front cover 26 is fitted onto the panel body 25. Further, another opening 33 is formed in the front cover 26 for the aforementioned rubber key 29 to be inserted therethrough. The opening 33 is formed at a position facing the rubber key 29 formed in the panel body 25 when the front cover 26 is fitted onto the panel body 25. With the front cover 26 fitted on the panel body 25, the rubber key 29 is exposed and projected from the front cover 26.

As shown in FIGS. 3, 5A and 5B, the rear cover 27 is an approximately box-like member with its front side being open. The panel body 25 is installed into the rear cover 27. The aforementioned rotation shaft 71 is fitted on an upper-end portion of the rear cover 27 on both lateral sides of the left and right.

An opening 34 is formed in the rear cover 27. The opening 34 is formed at a position facing the rubber key 29 formed in the panel body 25 when the panel body 25 is fitted into the rear cover 27.

Figure 11:
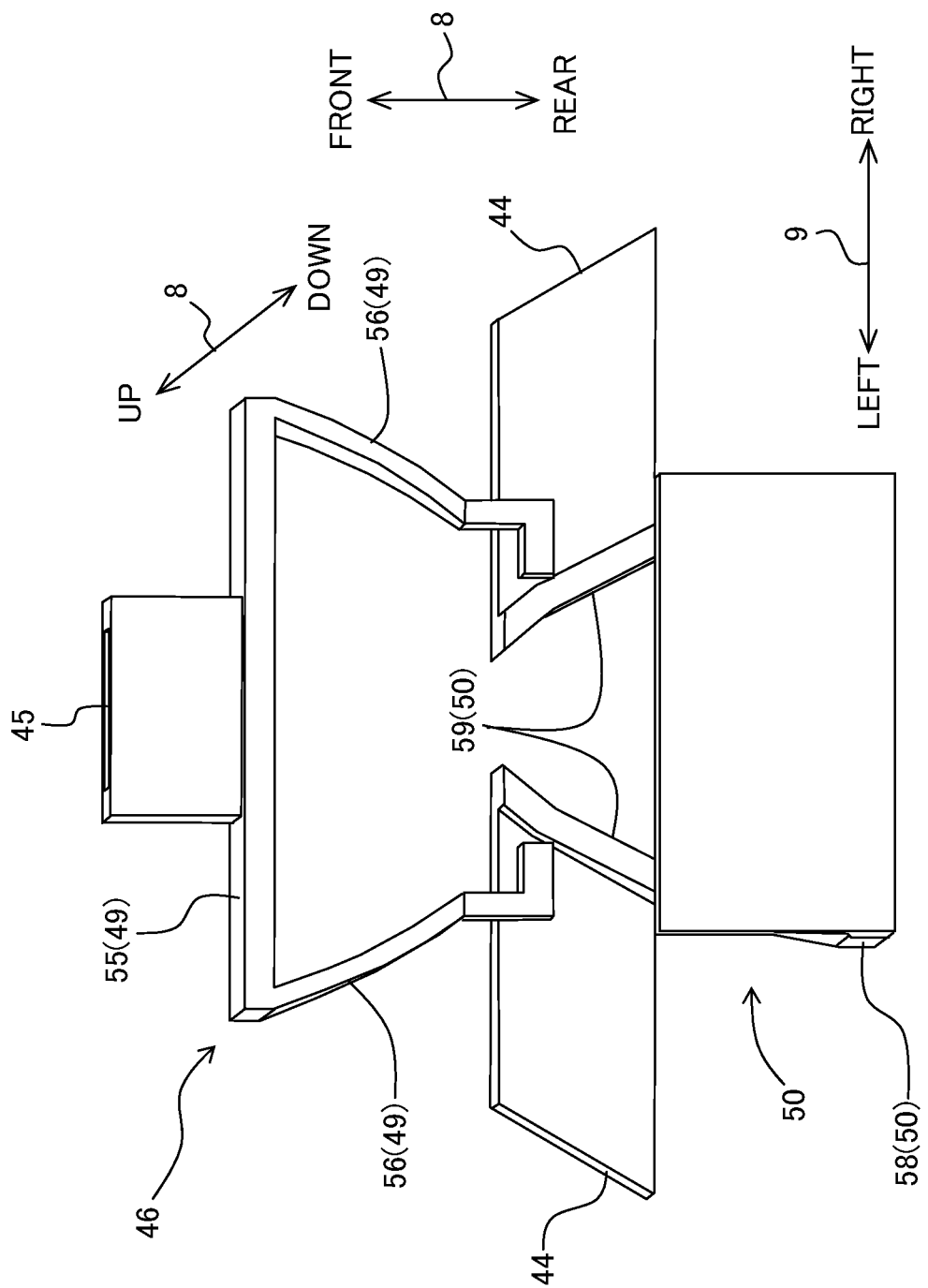
FIG. 11 is a perspective view when observing an operating member, the elastic deformation member, and retained members from the bottom side.

A contact member 35 is provided on the rear surface of the rear cover 27 to contact with an aftermentioned elastic deformation member 46. As shown in FIGS. 5A, 5B and 11, the contact member 35 includes a pair of lateral plates 39 and 40 extending rearward from the right end and the left end of opening 34, and a back plate 42 arranged to join the extension ends of the pair of lateral plates 39 and 40. The aftermentioned elastic deformation member 46 is arranged in a space 22 (see FIG. 5B) defined by the pair of lateral plates 39 and 40, and the back plate 42.

In this embodiment, the pair of lateral plates 39 and 40 are inflected, and the elastic deformation member 46 undergoes elastic deformation by causing inflection apical ends 47, which are the apical ends of the inflection, to contact with the elastic deformation member 46.

<The Retention Mechanism 81>

The retention mechanism 81 includes retaining members 43, retained members 44, the elastic deformation member 46, and the operating member 45 which will all be described below in detail.

<The Retaining Members 43>

The retaining members 43 shown in FIG. 5A are fitted on the printer case 14. In this embodiment, two retaining members 43 are provided across the aftermentioned retained members 44. Further, the retaining members 43 are arranged above the pair of lateral plates 39 and 40 in the up-down direction 7. The retaining member 43 on the left side is provided at a position facing the lateral plate 40 on the left side in the left-right direction 9, while retaining member 43 on the right side is provided at a position facing the lateral plate 39 on the right side in the left-right direction 9.

Figure 2A:
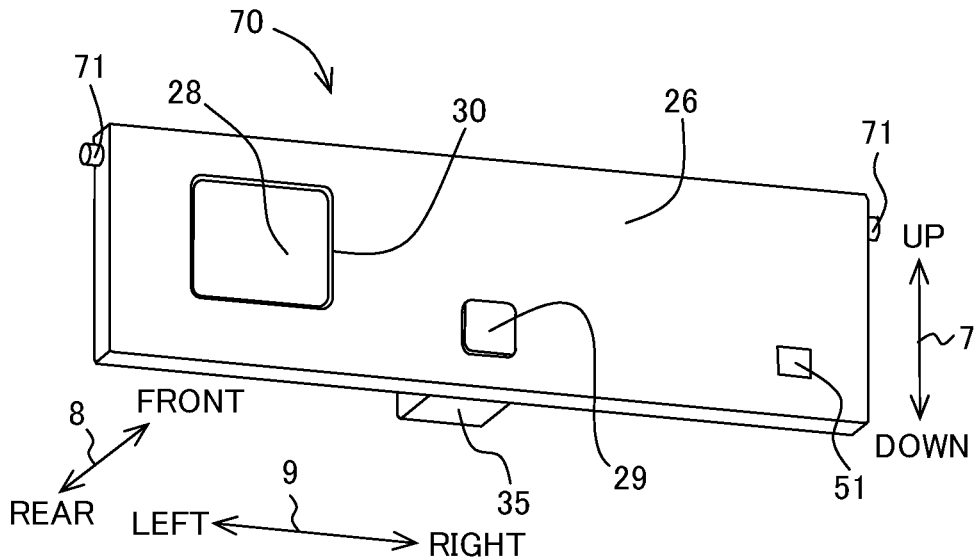
FIG. 2A is a front-side perspective view of the panel.
Figure 2B:
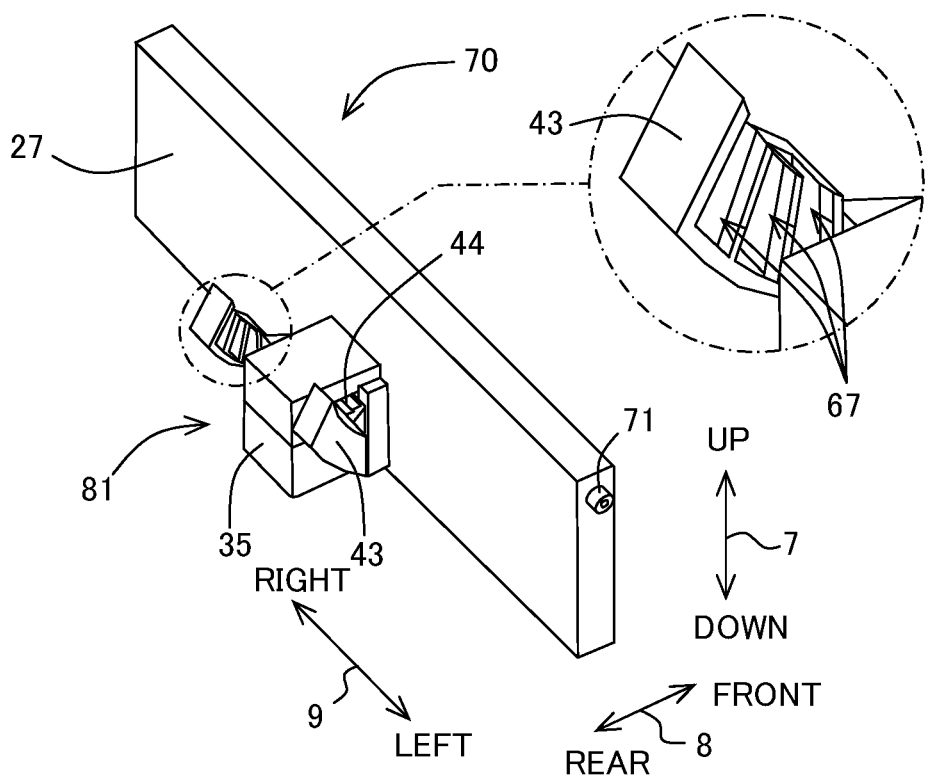
FIG. 2B is a rear-side perspective view of the panel.

Each of the two retaining members 43 includes at least one (three in this embodiment) recess 67 (an example of the engaging portion of the present invention). In the retaining member 43 on the left side, the recesses 67 are formed in the surface on the right side to dent leftward. In the retaining member 43 on the right side, the recesses 67 are formed in the surface on the left side to dent rightward. As shown in FIG. 2B, the three recesses 67 provided in each of the retaining members 43 are formed at predetermined intervals in the circumferential direction of concentric circles about the rotation shaft 71 of the panel 70. Each of the recesses 67 may engage an apical end 48 of the aftermentioned retained members 44.

Further, as an example of the engaging portion of the present invention, the recesses 67 are provided in the retaining members 43 in this embodiment. However, the engaging portion of the present invention may also not be the recesses 67. For example, if a recess is provided in each of the apical ends 48 of the aftermentioned retained members 44, then the engaging portion of the present invention is a projection to engage the recess.

<The Retained Members 44>

The retained members 44 shown in FIGS. 3, 5A, 5B, and 11 are fitted on the panel 70. In particular, the retained members 44 are fitted on the aftermentioned elastic deformation member 46 laid in the space 22 formed by the pair of lateral plates 39 and 40 and back plate 42 of the panel 70.

The retained members 44 are provided to correspond respectively to the retaining members 43. That is, like the retaining members 43, two retained members 44 are provided in this embodiment. These two retained members 44 are provided at positions facing the retaining members 43 in the left-right direction 9. In detail, one of the two retained members 44 is provided on the left side of the retaining member 43 on the right side, while the other of the two retained members 44 is provided on the right side of the retaining member 43 on the left side. The two retained members 44 are coupled to a second flexible member 50 of the aftermentioned elastic deformation member 46, and extend from the second flexible member 50 toward the retaining members 43. The retained members 44 are shaped like long plates in the left-right direction 9. The left end of the retained member 44 on the left side is inclined such that its rear part is positioned to the left side of its front part. Likewise, the right end of the retained member 44 on the right side is inclined such that its rear part is positioned to the right side of its front part.

The apical ends 48 of the retained members 44 extending toward the retaining members 43 are able to engage and disengage the recesses 67 provided in the retaining members 43, respectively. The retained members 44 are maintained at the present positions by engaging the recesses 67. The retained members 44 are separated from the recesses 67 by the elastic deformation of the aftermentioned elastic deformation member 46.

<The Elastic Deformation Member 46>

As shown in FIGS. 3, 5A, 5B, and 11, the elastic deformation member 46 in this embodiment is constituted by a first flexible member 49 and the second flexible member 50. While the elastic deformation member 46 is made from resin in this embodiment, the elastic deformation member 46 may also be made from metal, for example, other than resin.

The first flexible member 49 is arranged to be movable in the front-rear direction 8, in the space 22 defined by the pair of lateral plates 39 and 40 and back plate 42 of the panel 70. Further, the first flexible member 49 is movable between the position shown in FIGS. 5A and 5B, and the position shown in FIGS. 6A and 6B to the rear side of the position of FIGS. 5A and 5B.

The first flexible member 49 includes a plate-like member 55 having thickness in the front-rear direction 8, a pair of elastic plates 56 extending rearward from the left and right ends of the plate-like member 55, and projections 57 extending frontward from a central portion of the front surface of the plate-like member 55. The plate-like member 55, elastic plates 56, and projections 57 are formed into one body from resin.

The elastic plates 56 (an example of the first plate member) are shaped like plates, and extend from the base ends, where the plate-like member 55 is connected, to the tip ends thereof. With the elastic plate 56 on the right side, the tip end extends obliquely to the left-rear side of the base end, while with the elastic plate 56 on the left side, the tip end extends obliquely to the right-rear side of the base end. Therefore, between the elastic plate 56 on the right side and the elastic plate 56 on the left side, the interval (the distance in the left-right direction 9) on the rear side is smaller than that on the front side, and thus the tip ends of the elastic plates 56 extend in such orientations as to get closer to each other. The pair of elastic plates 56 are in respective contact with the inflection apical ends 47 of the pair of lateral plates 39 and 40 of the contact member 35.

When moving from the position of FIGS. 5A and 5B to the position of FIGS. 6A and 6B, the pair of elastic plates 56 are pressed against the contact member 35. The two inflection apical ends 47 are formed at the left and right of the contact member 35 to be contactable with the elastic plates 56. In detail, on the right side of the right-side elastic plate 56, one of the inflection apical ends 47 is arranged to contact with the right-side elastic plate 56. Further, on the left side of the left-side elastic plate 56, the other of the inflection apical ends 47 is arranged to contact with the left-side elastic plate 56. Due to the reaction force from the contact member 35, the pair of elastic plates 56, which are pressed against the inflection apical ends 47 of the contact member 35, undergo elastic deformation to turn in the left-right direction 9 about the connection parts with the plate-like member 55 (see FIG. 6A). That is, the first flexible member 49 contacts with the contact member 35 on the outside, and is caused to bend by a force applied from the contact member 35. Further, the first flexible member 49 undergoes elastic deformation in the left-right direction 9, namely, an orientation along the rotation shaft 71 of the panel 70.

The projections 57 are fitted into the aftermentioned operating member 45. By virtue of this, the first flexible member 49 is coupled with the operating member 45. The plate-like member 55 and projections 57 are an example of the operation connecting member of the present invention.

As shown in FIGS. 3, 5A and 5B, the second flexible member 50 is arranged on the rear side of the first flexible member 49 to be in contact with the tip ends of the pair of elastic plates 56 of the first flexible member 49. Further, like the first flexible member 49, the second flexible member 50 is arranged in the space 22 defined by the pair of pair of lateral plates 39 and 40 and back plate 42 of the panel 70.

The second flexible member 50 includes a plate-like member 58 having thickness in the front-rear direction 8, and a pair of elastic plates 59 extending frontward from the left and right ends of the plate-like member 58. The plate-like member 58 and elastic plates 59 are formed into one body from resin.

The plate-like member 58 is arranged in contact with the back plate 42. The elastic plates 59 are shaped like plates extending from the base ends, where the plate-like member 58 is connected, to the tip ends thereof. With the elastic plate 59 on the right side (an example of the first connecting member of the present invention), the tip end extends to the left-front side of the connection part with the plate-like member 58, while with the elastic plate 59 on the left side (an example of the second connecting member of the present invention), the tip end extends to the right-front side of the connection part with the plate-like member 58. At somewhere below their tip ends, the pair of elastic plates 59 are in contact with the tip ends of the pair of elastic plates 56 of the first flexible member 49. In detail, the tip end of the elastic plate 59 on the right side is in contact with the elastic plate 56 on the right side to the left side of the right-side elastic plate 56 of the first flexible member 49. Further, the tip end of the elastic plate 59 on the left side is in contact with the elastic plate 56 on the left side to the right side of the left-side elastic plate 56 of the first flexible member 49. Further, the tip end of the elastic plate 56 on the right side is inflected leftward, while the tip end of the elastic plate 56 on the left side is inflected rightward. Then, the elastic plates 59 of the second flexible member 50 are arranged to come between the tip ends of the two elastic plates 56 of the first flexible member 49.

By being pressed against the pair of elastic plates 56 of the first flexible member 49 moving from the position of FIGS. 5A and 5B to the position of FIGS. 6A and 6B, the pair of elastic plates 59 (an example of the second plate member of the present invention) undergoes elastic deformation to turn in the left-right direction 9 about the connection parts with the plate-like member 58 (see FIGS. 6A and 6B). That is, like the first flexible member 49, the second flexible member 50 undergoes elastic deformation in the left-right direction 9, namely, an orientation along the rotation shaft 71 of the panel 70.

Further, as shown in FIG. 3, the pair of elastic plates 59 are shaped like plates, and coupled with the retained members 44 on the upper parts of the tip-end portions. In detail, on the tip-end side of the elastic plates 59, the upper parts are coupled with the retained members 44, while the lower parts are contactable with the tip ends of the elastic plates 56 of the first flexible member 49. Between the two provided retained members 44, the retained member 44 on the right side is arranged to project rightward from the upper part of the tip-end portion of the elastic plate 59 on the right side. Further, between the two provided retained members 44, the retained member 44 on the left side is arranged to project leftward from the upper part of the tip-end portion of the elastic plate 59 on the left side. That is, the second flexible member 50 includes the right-side elastic plate 59 coupled with one of the retained members 44 (the retained member 44 on the right side), and the left-side elastic plate 59 coupled with the other of the retained members 44 (the retained member 44 on the left side). Further, the right-side elastic plate 59 and the left-side elastic plate 59 are arranged obliquely such that between the right-side elastic plate 59 and the left-side elastic plate 59, the interval (the distance in the left-right direction 9) on the front side is smaller than that on the rear side. Further, the tip-end portions of the elastic plates 59 on the lower side, i.e., below the retained members 44, come between the two tip ends of the first flexible member 49 to contact with the tip ends of the first flexible member 49. Further, as described above, the apical ends 48 of the two retained members 44 are capable of engaging and disengaging the recesses 67 provided in the retaining members 43.

With the first flexible member 49 moving in the front-rear direction 8, the elastic deformation member 46 changes its state between a first state shown in FIGS. 5A and 5B in which the first flexible member 49 and second flexible member 50 have not undergone elastic deformation, and a second state shown in FIGS. 6A and 6B in which the first flexible member 49 and second flexible member 50 have undergone elastic deformation from the first state. That is, when the first flexible member 49 is at the position shown in FIGS. 5A and 5B, the elastic deformation member 46 is in the first state, while when the first flexible member 49 is at the position shown in FIGS. 6A and 6B, the elastic deformation member 46 is in the second state.

As shown in FIGS. 5A and 5B, when the elastic deformation member 46 is in the first state, because the pair of elastic plates 56 do not receive the reaction force from the contact member 35, the first flexible member 49 does not undergo elastic deformation. Further, when the elastic deformation member 46 is in the first state, because the pair of elastic plates 59 are not pressed against the pair of elastic plates 56 of the first flexible member 49, the second flexible member 50 does not undergo elastic deformation. That is, the first state is a stationary state in which no external force is applied to the elastic deformation member 46. On this occasion, the retained members 44 coupled with the second flexible member 50 engage the recesses 67 of the retaining members 43.

On the other hand, as shown in FIGS. 6A and 6B, when the elastic deformation member 46 is in the second state, because the pair of elastic plates 56 receive the reaction force from the contact member 35, the first flexible member 49 has undergone elastic deformation from the first state. On this occasion, the elastic plate 56 on the right side bends leftward, while the elastic plate 56 on the left side bends rightward. That is, when the elastic deformation member 46 is in the second state, being pressed by the inflection apical ends 47 of the contact member 35, the first flexible member 49 bends from the stationary state in the pressing orientations. Further, the inflection apical ends 47 are arranged on the outside such that the tip ends of the elastic plates 56 may bend inward.

Further, when the elastic deformation member 46 is in the second state, because the pair of elastic plates 59 are pressed against the pair of elastic plates 56 of the first flexible member 49, the second flexible member 50 undergoes elastic deformation from the first state. On this occasion, the elastic plate 59 on the right side bends leftward, while the elastic plate 59 on the left side bends rightward. That is, when the elastic deformation member 46 is in the second state, being pressed by the pair of elastic plates 56 of the first flexible member 49, the second flexible member 50 bends from the stationary state in the pressing orientations. Further, the right-side elastic plate 59 and left-side elastic plate 59 bend in such orientations as to get closer to each other during the state change from the first state to the second state.

Along with this bending, any overlapped areas disappear between the retained members 44 and the retaining members 43 in the left-right direction 9, and thus the retained members 44 coupled to the second flexible member 50 are separated from the retaining members 43. That is, the second flexible member 50 bends according to the bending of the first flexible member 49, so as to separate the retained members 44 from the retaining members 43.

<The Operating Member 45>

As shown in FIGS. 3, 5A, 5B, and 11, by engaging the projections 57, the operating member 45 is fitted on the front surface of the plate-like member 55 of the first flexible member 49. The operating member 45 is inserted in the recess formed at the rear side of the rubber key 29. By virtue of this, along with the rubber key 29, the operating member 45 is arranged to project from the front cover 26 via the opening 33, that is, to project from the surface of the panel 70 (the front surface of the front cover 26). Further, the operating member 45 may also not project from the surface of the panel 70 if it can be pressed and pulled outward by a user.

Further, corresponding to the rubber key 29 formed in the rotation fore-end portion downward from the rotation shaft 71 of the panel 70, the operating member 45 is also arranged in the rotation fore-end portion downward from the rotation shaft 71 of the panel 70.

The user can press the operating member 45 rearward by pressing the rubber key 29 projecting from the front cover 26 of the panel 70 via the opening 33. Here, the orientation of pressing the operating member 45 is orthogonal to the surface of the panel 70, namely, the front surface of the front cover 26 of the panel 70. In other words, the direction of pressing the operating member 45 is the same as the direction of rotating the panel 70 from the second position to the first position, namely, the direction of the arrow 17 shown in FIG. 1B.

If the operating member 45 is pressed, then the first flexible member 49 of the elastic deformation member 46 is moved rearward, and thus the elastic deformation member 46 changes its state from the first state to the second state. That is, the operating member 45 is manipulated, namely, pressed, to move the first flexible member 49 rearward from the position shown in FIGS. 5A and 5B to the position shown in FIGS. 6A and 6B, thereby changing the state of the elastic deformation member 46. In detail, if the first flexible member 49 is moved rearward, then the inflection apical ends 47 press the pair of elastic plates 56, which then undergo elastic deformation to cause the first flexible member 49 to bend. As the first flexible member 49 bends, it presses the second flexible member 50 to cause the same to bend. That is, the elastic deformation member 46 is bent by a force applied from outside according to the manipulation of the operating member 45.

<Operation of the Electronic Apparatus>

The operation of the electronic apparatus according to the present invention will be explained below.

First, an explanation will be made for the case that the panel 70 is rotated from the second position to the first position by the user pressing the operating member 45. In the following explanation, the initial state of the elastic deformation member 46 is supposed to be the state shown in FIG. 7A. In the state shown in FIG. 7A, the elastic deformation member 46 is in the first state which is the stationary state without any force applied from outside. Further, in the state shown in FIG. 7A, the retaining members 43 retain the apical ends 48 of the retained members 44 by letting the same engage the most frontward recesses 67 among the recesses 67 formed in the retaining members 43.

If the user presses the operating member 45 via the rubber key 29, then as shown in FIG. 7B, the pair of elastic plates 56 of the first flexible member 49 coupled with the operating member 45 are pressed by the inflection apical ends 47 of the contact member 35 to move rearward, while deforming such that the interval between each other becomes shorter in the left-right direction 9. Between the pair of elastic plates 56 of the first flexible member 49 in the left-right direction 9, the interval on the front side is greater than that on the rear side. Therefore, along with the rearward movement of the first flexible member 49, the interval between the tip ends of the first flexible member 49 becomes smaller gradually. Then, because of the deformation of the pair of elastic plates 56 of the first flexible member 49, the pair of elastic plates 59 of the second flexible member 50 let the contact parts with the first flexible member 49 move rearward, and deform to have a shorter interval between each other in the left-right direction 9. Between the pair of elastic plates 56 of the second flexible member 50 in the left-right direction 9, the interval on the rear side is greater than that on the front side. Therefore, as the contact parts with the first flexible member 49 move rearward, the interval between the tip ends of the second flexible member 50 becomes smaller gradually. If the second flexible member 50 bends, then the retained members 44 coupled to the second flexible member 50 also bend in the same orientations as the second flexible member 50. By virtue of this, the apical ends 48 of the retained members 44 are separated from the recesses 67 formed in the retaining members 43, thereby being released from the retained state by the retaining members 43.

In the above manner, if the user presses the operating member 45 via the rubber key 29, then the elastic deformation member 46 is pressed by the contact member 35 of the panel 70 to change its state from the first state (the state shown in FIG. 7A) to the second state (the state shown in FIG. 7B).

The elastic deformation member 46 is configured not to bend more than when it is in the second state. Hence, with the elastic deformation member 46 in the second state, if the user further presses the operating member 45 via the rubber key 29, then the pressing force is transmitted from the operating member 45 to the second flexible member 50 via the first flexible member 49, and thereby the plate-like member 58 of the second flexible member 50 presses the back plate 42 of the contact member 35. By virtue of this, the panel 70 rotates in the direction of the arrow 17 (see FIG. 1B).

If the panel 70 rotates in the direction of the arrow 17, then the retained members 44 also rotate in the direction of the arrow 17. In particular, the retained members 44 move from the position facing the recesses 67 on the most frontward side among the recesses 67 of the retaining members 43, to the position facing the recesses 67 on the more rearward side, i.e., the position of FIG. 6A in this example.

In the state shown in FIG. 6A, if the user eases or lessens the force of pressing the operating member 45 via the rubber key 29, then the first flexible member 49 coupled with the operating member 45 moves frontward, in particular, from the position shown in FIG. 6A to the position shown in FIG. 5A. Thus, because the pair of elastic plates 56 of the first flexible member 49 are no longer pressed by the inflection apical ends 47 of the contact member 35, a restoring force acts. By virtue of this, the bending of the pair of elastic plates 56 is eased or relaxed so as to increase the interval between each other in the left-right direction 9. Then, because of easing the bending of the pair of the elastic plates 56 of the first flexible member 49, the restoring force acts on the pair of elastic plates 59 of the second flexible member 50. By virtue of this, the bending of the pair of elastic plates 59 is eased so as to increase the interval between each other in the left-right direction 9. As the bending of the second flexible member 50 is eased, the apical ends 48 of the retained members 44 coupled to the second flexible member 50 engage the recesses 67 formed in the retaining members 43, so as to be retained by the retaining members 43. On this occasion, the inflection apical ends 47 of the contact member 35 maintain the state of contact with the pair of elastic plates 56, but do not press the elastic plates 56. Further, the tip ends of the first flexible member 49 do not press the second flexible member 50, but maintain the state of contact. That is, with the first flexible member 49 and second flexible member 50 undergoing no elastic deformation, the retained members 44 are retained by the retaining members 43.

In this manner, if the user eases the force of pressing the operating member 45 via the rubber key 29, the elastic deformation member 46 changes its state from the second state (the state shown in FIGS. 6A and 6B) to the first state (the state shown in FIGS. 5A and 5B).

Next, an explanation will be made for the case that the panel 70 is rotated from the first position to the second position by the user pulling the panel 70 in the direction of the arrow 18. In the following explanation, the initial state of the elastic deformation member 46 is supposed to be the state shown in FIGS. 5A and 5B. In the state shown in FIGS. 5A and 5B, the elastic deformation member 46 is in the first state which is the stationary state without any force applied from outside. Further, in the state shown in FIGS. 5A and 5B, the retaining members 43 retain the apical ends 48 of the retained members 44 by letting the same engage the most rearward recesses 67 among the recesses 67 formed in the retaining members 43.

In the state shown in FIGS. 5A and 5B, if the user pulls the panel 70 in the direction of the arrow 18, then the elastic deformation member 46 is also moved in the direction of the arrow 18 by the plate-like member 58 of the second flexible member 50 being pressed by the back plate 42 of the contact member 35. By virtue of this, the apical ends 48 of the retained members 44 coupled with the second flexible member 50 come to contact with wall surfaces 68 constituting the front sides of the recesses 67 formed in the retaining members 43.

The wall surfaces 68 are inclined to come more frontward as getting closer to the retained members 44 in the left-right direction 9. By virtue of this, a predetermined angle less than 90 degrees is formed between the inclined orientation of the wall surfaces 68 and the direction of the arrow 18. As a result, the retained members 44, being pulled in the frontward orientation, come to contact with the wall surfaces 68 to bend the elastic plates 59, and thereby can get over the wall surfaces 68. If the retained members 44 get over the wall surfaces 68, then the deformation of the elastic plates 59 is released; hence, the retained members 44 come to engage the recesses 67 on the front side of the recesses 67 engaged previously.

Here, the predetermined angle is set such that the retained members 44 can get over the wall surfaces 68 even though the force of pulling the retained members 44 in the direction of the arrow 18 is smaller than a force which may cause damage to at least one part of the retained members 44 and the retaining members 43.

On the other hand, the panel 70 is configured to be rotatable from the second position to the first position only by way of the user pressing the operating member 45. That is, even if the user presses the surface of the panel 70 in the direction of the arrow 17 except for the operating member 45, the panel 70 is still not rotatable from the second position to the first position. The reason will be explained below.

As shown in FIG. 5A, wall surfaces 69 on the rear side are formed in accord with the left-right direction 9 to define the recesses 67 formed in the retaining members 43. By virtue of this, an angle of 90 degrees is formed between the orientation of the wall surfaces 69 (the left-right direction 9) and the direction of the arrow 17. As a result, the retained members 44, being pressed in the direction of the arrow 17, cannot get over the wall surfaces 69. Further, if the panel 70 is pressed forcibly with a great force, then it is possible to cause damage to at least one part of the retained members 44 and the retaining members 43.

In the above manner, when the panel 70 is rotated in the direction of the arrow 18 to cause the recesses 67 of the retaining members 43 to contact with the apical ends 48 of the retained members 44, with respect to the direction of the arrow 18, the angle of the contact surfaces of the recesses 67 with the apical ends 48 is such an angle as to allow the panel 70 to rotate in the direction of the arrow 18. On the other hand, when the panel 70 is rotated in the direction of the arrow 17 to cause the recesses 67 of the retaining members 43 to contact with the apical ends 48 of the retained members 44, with respect to the direction of the arrow 17, the angle of the contact surfaces of the recesses 67 with the apical ends 48 is such an angle as to prevent the panel 70 from rotation in the direction of the arrow 17.

[Effects of the Embodiment]

According to this embodiment, the elastic deformation member 46 undergoes elastic deformation only when the panel 70 is rotated by the retained members 44 being separated from the retaining members 43, but does not undergo elastic deformation when the panel 70 is retained at a predetermined rotation angle by the retaining members 43 retaining the retained members 44. Here, the time of the panel 70 being retained at the predetermined rotation angle is predominantly longer than the time of the panel 70 being rotated. Hence, according to this embodiment, it is possible to reduce the age-related deterioration of the elastic deformation member 46 because of keeping the elastic deformation member 46 in a state of longtime elastic deformation.

Further, when a manipulation of the operating member 45 such as pressing and the like accompanies the elastic deformation of the elastic deformation member 46, if the interval between the operating member 45 and the elastic deformation member 46 is long, then for a small amount of manipulation of the operating member 45, the elastic deformation member 46 may still undergo a great amount of elastic deformation. According to this embodiment, however, the manipulation of the operating member 45 such as pressing and the like is transmitted to the second flexible member 50 via the first flexible member 49. As a result, even though the interval between the operating member 45 and the elastic deformation member 46 is long, it is still possible to keep a small amount of elastic deformation of the elastic deformation member 46 for a conceivable amount of manipulation of the operating member 45.

Further, according to this embodiment, the two retaining members 43 are arranged outside of the two retained members 44 in the deformation (displacement) orientation of the retained members 44. By virtue of this, it is possible to provide a long interval between the two retaining members 43. As a result, it is possible to stably retain the panel 70 in a predetermined posture.

Further, according to this embodiment, if the operating member 45 is pressed, then the elastic deformation member 46 is changed into the second state, whereby the retained members 44 are separated from the retaining members 43. By virtue of this, the engagement between the retained members 44 and the retaining members 43 is released, and the panel 70 becomes rotatable. Then, if the operating member 45 is further pressed, the panel 70 is rotated to the side of the first position. That is, according to this embodiment, it is possible to rotate the panel 70 from the second position to the first position just by one manipulation, namely, pressing the operating member 45. Further, according to this embodiment, because the operating member 45 is arranged in the rotation fore-end portion of the panel 70, it is possible to reduce the pressing force on the operating member 45 required for changing the posture of the panel 70.

Further, according to this embodiment, the wall surfaces 68, which define the recesses 67 of the retaining members 43, are moderately inclined to the rotation direction of the panel 70, namely, the movement direction of the elastic deformation member 46. Hence, according to this embodiment, it is possible to easily perform the rotation of the panel 70 in the direction of the arrow 18.

Further, according to this embodiment, as long as the state of the elastic deformation member 46 is not changed by manipulating the operating member 45, the panel 70 is not rotated from the second position to the first position. Hence, when the panel 70 is at the second position, even if the panel 70 is manipulated by pressing any part other than the operating member 45 provided in the panel 70 such as the liquid crystal panel 28 of the touch panel or the operation key 51, it is still possible to prevent the panel 70 from mistakenly changing the posture to the first position by having pressed that part.

Further, according to this embodiment, because the elastic deformation member 46 elastically deforms in an orientation along the rotation shaft 71 of the panel 70, the position of arranging the retaining members 43 is not confined by the position of the rotation shaft 71 of the panel 70. That is, according to this embodiment, it is possible to raise the degree of freedom of arranging the retaining members 43.

Further, according to this embodiment, because the operating member 45 is arranged in the surface of the panel 70 to project from that surface, it is possible to easily manipulate the operating member 45.

Further, according to this embodiment, when the operating member 45 is not manipulated, namely, when the elastic deformation member 46 is in the first state, the inflection apical ends 47 of the contact member 35 are still in contact with the pair of elastic plates 56. Hence, the elastic deformation member 46 will never jounce.

[First Modification]

In the above embodiment, the elastic deformation member 46 is configured to undergo elastic deformation in a direction along the rotation shaft 71 of the panel 70. However, the elastic deformation member 46 may alternatively undergo elastic deformation in a direction orthogonal to the rotation shaft 71 of the panel 70 and along the surface of the panel 70. Further, in explaining the configuration and operation of an electronic apparatus in the following first modification, with respect to the same parts as in the above embodiment, the explanation will be simplified or omitted.

Figure 8:
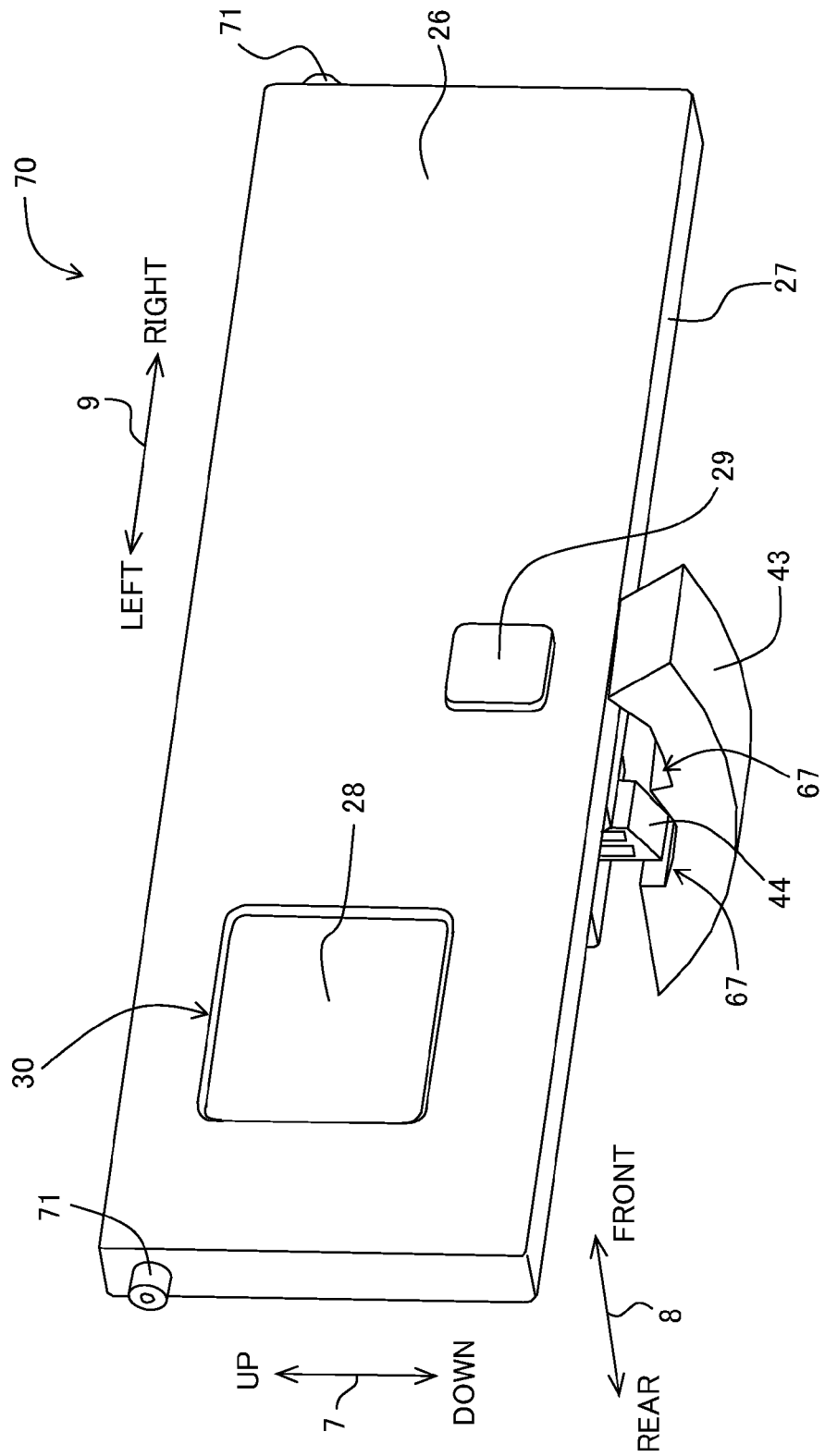
FIG. 8 is a front-side perspective view of the panel in accordance with a first modification.

As shown in FIG. 8, in the first modification, only one retaining member 43 is provided below the panel 70. Further, the recesses 67 of the retaining member 43 dent downward from the upper surface of the retaining member 43.

As shown in FIGS. 9A to 9D, only one retained member 44 is provided. Further, the elastic deformation member 46 is arranged to be rotated 90 degrees with the front-rear direction 8 as the axis with respect to that in the above embodiment, i.e., to extend downward, as shown in FIGS. 9A to 9D, from the elastic plate 59 on the downside of the second flexible member 50 of the elastic deformation member 46.

As the operation, when the panel 70 is rotated from the second position to the first position, in the initial state shown in FIG. 9A, if the user presses the operating member 45, then the elastic deformation member 46 changes its state from the first state to the second state. By virtue of this, as shown in FIG. 9B, the retained member 44 is separated from the retaining member 43.

Next, if the user further presses the operating member 45, then the panel 70 rotates in the direction of the arrow 17. By virtue of this, the retained member 44 also rotates in the direction of the arrow 17 to move from the position shown by the solid line in FIG. 9B, to the position shown in FIG. 9C, i.e., the position facing the most rearward recess 67 of the retaining member 43.

In the state shown in FIG. 9C, if the user eases the force of pressing the operating member 45, then as shown in FIG. 9D, the retained member 44 comes to engage the recess 67 formed in the retaining member 43, so as to be retained by the retaining member 43.

Further, when the panel 70 is rotated from the first position to the second position, in the initial state shown in FIG. 9D, if the user holds and pulls the panel 70, then the panel 70, retained member 44 and elastic deformation member 46 will all move in the direction of the arrow 18. By virtue of this, the apical end 48 of the retained member 44 comes to contact with the wall surface 68 on the front side of the recess 67 formed in the retaining member 43.

The wall surface 68 is moderately inclined such that the more to the front side, the more to the upper side. By virtue of this, in the same manner as in the above embodiment, a predetermined angle is formed between the inclined orientation of the wall surface 68 and the direction of the arrow 18. As a result, the retained member 44 being pulled in the frontward orientation can get over the wall surface 68, and the retained member 44 having gotten over the wall surface 68 comes to engage the recess 67 on the front side of the recess 67 engaged previously.

On the other hand, the wall surface 68 has a smaller inclination angle than the wall surface 69 on the rear side of the recess 67 formed in the retaining member 43. That is, the angle formed between the orientation of the wall surface 69 and the direction of the arrow 17 is larger than the angle formed between the orientation of the wall surface 68 and the direction of the arrow 18. As a result, the retained member 44 being pressed in the direction of the arrow 17 cannot get over the wall surface 69.

In the above manner, like the above embodiment, the panel 70 is configured to be rotatable from the second position to the first position only by the user pressing the operating member 45.

According to the first modification, the retaining member 43 is arranged at a position farther from the rotation shaft 71 of the panel 70 than the rotation fore-end of the panel 70. Hence, it is possible to arrange the retained member 44 being engaged with the retaining member 43, and the elastic deformation member 46 being connected to the retained member 44, to be away from the rotation shaft 71 of the panel 70. As a result, it is possible to consolidate the retention of the panel 70 to the printer case 14.

[Second Modification]

In the aforementioned embodiment, the elastic deformation member 46 is constructed of two members, i.e., the first flexible member 49 and the second flexible member 50. However, the elastic deformation member 46 may also be constructed of one member. In such case, for example, the elastic deformation member 46 may be constructed of the first flexible member 49 alone, and the retained members 44 may be fitted on the fore-end portions of the pair of the elastic plates 56 of the first flexible member 49. By configuration in this manner, if the pair of elastic plates 56 contact with the inflection apical ends 47 of the contact member 35 so as to bend such that the interval between each other becomes shorter in the left-right direction 9, then the retained members 44 are separated from the retaining members 43.

[Third Modification]

In the aforementioned embodiment, the elastic deformation member 46 is arranged to be movable relative to the panel 70, and the contact member 35 is arranged to be fixed on the panel 70. However, the elastic deformation member 46 and contact member 35 are not limited to such kind of arrangement. For example, the elastic deformation member 46 may be arranged to be fixed on the panel 70, whereas the contact member 35 may be arranged to be movable relative to the panel 70. Then, the elastic deformation member 46 may undergo elastic deformation by being pressed by the contact member 35 which is caused to move by manipulating the operating member 45.

[Fourth Modification]

In the aforementioned embodiment, the retained members 44 retained by the retaining members 43 are formed in the second flexible member 50. However, if the second flexible member 50 deforms according to the deformation of the first flexible member 49, and if the retained members 44 are separated from the retaining members 43 according to the deformation of the second flexible member 50, then the retained members 44 may also not be formed directly in the second flexible member 50. That is, it may be configured to further have a third deformation portion which deforms according to the deformation of the second flexible member 50, and the retained members 44 are separated from the retaining members 43 according to the deformation of the third deformation portion.

What is claimed is:

1. An electronic apparatus comprising:
    a panel having at least one of an input section to which operation instructions for the electronic apparatus are inputted and a display section;
    a main body configured to retain the panel rotatably;
    a retention mechanism configured to retain the panel at a predetermined rotation angle and including:
        a retaining member provided in the main body;
        a retained member provided on the panel and configured to be retained by the retaining member;
        an elastic deformation member configured to be connected to the retained member and to be changeable between a first state in which the elastic deformation member is not elastically deformed and a second state, occurring at least during a rotation of the panel, in which the elastic deformation member is elastically deformed;
        a contact member configured to contact with the elastic deformation member and change the state of the elastic deformation member; and
        an operating member configured to receive an operation for making the elastic deformation member contact with the contact member,
    wherein in a state that the elastic deformation member is in the first state, the retained member is retained by the retaining member, and in a state that the elastic deformation member is in the second state, the retained member is separated from the retaining member.

2. The electronic apparatus according to claim 1,
    wherein the elastic deformation member is deformed by a force applied from outside during the operation to the operating member,
    the first state is an undeformed state in which any force is not applied to the elastic deformation member from outside, and
    the second state is a state in which the elastic deformation member has been deformed, from the undeformed state, in an orientation along a rotation shaft of the panel by contacting with the contact member.

3. The electronic apparatus according to claim 2,
    wherein the elastic deformation member comprises:
    a first flexible member configured to be connected to the operating member and to be deformed by contacting with the contact member; and
    a second flexible member configured to be connected to the retained member and to separate the retained member from the retaining member by being deformed in response to the deformation of the first flexible member.

4. The electronic apparatus according to claim 3, wherein in a case that the elastic deformation member is in the first state, the first flexible member maintains a state in which the first flexible member contacts with the second flexible member.

5. The electronic apparatus according to claim 3, wherein the first flexible member has an operation connecting member configured to be connected to the operating member, and a first plate member configured to contact with the contact member, extending from the operation connecting member, and a tip portion of which is elastically deformable.

6. The electronic apparatus according to claim 5, wherein the second flexible member has a second plate member configured to be deformed by contacting with the first plate member.

7. The electronic apparatus according to claim 6, wherein the second plate member of the second flexible member is configured to be connected to the retained member.

8. The electronic apparatus according to claim 2,
    wherein the retaining member is provided as two retaining members,
    the retained member is provided as two retained members corresponding to the retaining members respectively,
    the elastic deformation member comprises a first connecting member configured to be connected to one of the retained members, and a second connecting member configured to be connected to the other of the retained members, and
    under a condition that the state of the elastic deformation member is changed from the first state to the second state, the first connecting member and the second connecting member are deformed in such an orientation as to get closer to each other.

9. The electronic apparatus according to claim 8,
    wherein the first flexible member has an operation connecting member configured to be connected to the operating member and two first plate members extending from the operation connecting member,
    the first connecting member and the second connecting member are provided in a second flexible member and arranged between tip portions of the two first plate members, and
    the contact member is configured to contact with the first plate members from outside of the first plate members.

10. The electronic apparatus according to claim 9, wherein the first plate members are arranged such that an interval between the tip portions thereof is smaller than an interval between connecting portions at which the first plate members are connected to the operation connecting member.

11. The electronic apparatus according to claim 9, wherein a tip portion of the first connecting member and a tip portion of the second connecting member are arranged between the two first plate members, and the tip portion of the first connecting member and the tip portion of the second connecting member are configured to be connected to the retained members respectively.

12. The electronic apparatus according to claim 1,
    wherein the panel rotates about a predetermined rotation shaft between a first position and a second position at which a rotation fore-end of the panel is positioned outwardly farther away from the main body than the first position,
    the operating member is arranged on a surface of the panel at a portion on a side of the rotation fore-end with respect to the rotation shaft and changes the state of the elastic deformation member into the second state by being pressed, and the direction in which the operating member is pressed is the same as a rotation direction of the panel from the second position to the first position.

13. The electronic apparatus according to claim 12, wherein the retaining member comprises at least one engaging portion along a rotation trajectory of the panel about the rotation shaft, the retained member comprises an engaged portion configured to be capable of engaging and disengaging with the engaging portion, in a state that the panel is rotated in one direction and the engaging portion and the engaged portion make contact with each other, an angle between a contact surface of the engaging portion with the engaged portion and the one direction allows the panel to rotate in the one direction, and in a state that the panel is rotated in the other direction and the engaging portion and the engaged portion make contact with each other, an angle between the contact surface of the engaging portion with the engaged portion and the other direction prevents the panel from rotating in the other direction.

14. The electronic apparatus according to claim 13, wherein the one direction is a direction in which the panel rotates from the first position to the second position and the other direction is a direction in which the panel rotates from the second position to the first position.

15. The electronic apparatus according to claim 1, wherein the contact member maintains a state in which the contact member contacts with the elastic deformation member in the first state.

16. The electronic apparatus according to claim 1, wherein the elastic deformation member is configured to be elastically deformable in an orientation along a rotation shaft of the panel.

17. The electronic apparatus according to claim 1, wherein the elastic deformation member is configured to be elastically deformable in an orientation orthogonal to a rotation shaft of the panel and along a surface of the panel.

18. The electronic apparatus according to claim 1, wherein the operating member is arranged on a surface of the panel to project from the surface.

* * * * *